(12) United States Patent
Van Haren et al.

(10) Patent No.: US 11,226,567 B2
(45) Date of Patent: Jan. 18, 2022

(54) METHODS AND APPARATUS FOR USE IN A DEVICE MANUFACTURING METHOD

(71) Applicant: ASML NETHERLANDS B.V., Veldhoven (NL)

(72) Inventors: Richard Johannes Franciscus Van Haren, Waalre (NL); Leon Paul Van Dijk, Eindhoven (NL); Ilya Malakhovsky, Eindhoven (NL); Ronald Henricus Johannes Otten, Rosmalen (NL); Mahdi Sadeghinia, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/638,552

(22) PCT Filed: Aug. 8, 2018

(86) PCT No.: PCT/EP2018/071492
§ 371 (c)(1),
(2) Date: Feb. 12, 2020

(87) PCT Pub. No.: WO2019/052746
PCT Pub. Date: Mar. 21, 2019

(65) Prior Publication Data
US 2020/0218169 A1     Jul. 9, 2020

(30) Foreign Application Priority Data
Sep. 18, 2017 (EP) ..................................... 17191649

(51) Int. Cl.
*G03F 7/20* (2006.01)
*G03F 9/00* (2006.01)

(52) U.S. Cl.
CPC .......... *G03F 7/70783* (2013.01); *G03F 7/707* (2013.01); *G03F 9/7034* (2013.01)

(58) Field of Classification Search
CPC ..... G03F 7/707; G03F 7/70783; G03F 9/7034
See application file for complete search history.

(56) References Cited

U.S. PATENT DOCUMENTS

| 10,508,896 B2 | 12/2019 | Nihtianov et al. |
| 2004/0185662 A1* | 9/2004 | Fujisawa ................. H01L 22/12 438/689 |

(Continued)

FOREIGN PATENT DOCUMENTS

| TW | 201729317 | 8/2017 |
| WO | 2016/087069 | 6/2016 |

OTHER PUBLICATIONS

"Improved Overlay Control via Feedforward of In-plane Deformation Measurements", Research Disclosure, Kenneth Mason Publications, Hampshire, UK, GB, vol. 621, No. 13, Jan. 1, 2016.

(Continued)

*Primary Examiner* — Deoram Persaud
(74) *Attorney, Agent, or Firm* — Pillsbury Winthrop Shaw Pittman LLP

(57) ABSTRACT

Methods and associated apparatus for reconstructing a free-form geometry of a substrate, the method including: positioning the substrate on a substrate holder configured to retain the substrate under a retaining force that deforms the substrate from its free-form geometry; measuring a height map of the deformed substrate; and reconstructing the free-form geometry of the deformed substrate based on an expected deformation of the substrate by the retaining force and the measured height map.

20 Claims, 10 Drawing Sheets

(56) References Cited

U.S. PATENT DOCUMENTS

| | | | | |
|---|---|---|---|---|
| 2006/0114436 | A1* | 6/2006 | Oesterholt | G03F 7/707 355/55 |
| 2011/0172982 | A1* | 7/2011 | Veeraraghavan ... | G03F 7/70783 703/13 |
| 2011/0262846 | A1* | 10/2011 | Tanabe | G03F 1/60 430/5 |
| 2015/0015861 | A1* | 1/2015 | Sentoku | G03F 7/70775 355/67 |
| 2015/0298282 | A1 | 10/2015 | Vukkadala et al. | |
| 2016/0239600 | A1* | 8/2016 | Tsai | G03F 7/707 |
| 2016/0290789 | A1* | 10/2016 | Smith | G01B 9/02027 |
| 2018/0342410 | A1* | 11/2018 | Hooge | H01L 21/027 |
| 2019/0041758 | A1* | 2/2019 | Van Dijk | G03F 7/70516 |
| 2019/0079411 | A1* | 3/2019 | Cekli | G03F 7/70258 |
| 2020/0124989 | A1* | 4/2020 | Ten Berge | G03F 7/70633 |
| 2020/0402252 | A1* | 12/2020 | Agarwal | G06T 7/0004 |
| 2021/0223696 | A1* | 7/2021 | Achanta | H01L 21/6715 |

OTHER PUBLICATIONS

International Search Report and Written Opinion issued in the corresponding International Patent Application No. PCT/EP2018/071492 dated Nov. 29, 2018.

Office Action issued in the corresponding Taiwanese Patent Application No. 107131655 dated Mar. 28, 2019.

* cited by examiner

METHODS AND APPARATUS FOR USE IN A DEVICE MANUFACTURING METHOD

CROSS-REFERENCE TO RELATED APPLICATIONS

This application is the U.S. national phase entry of PCT Patent Application No. PCT/EP2018/071492, which was filed Aug. 8, 2018 which claims the benefit of priority of European Patent Application No. 17191649.7, which was filed on Sep. 18, 2017 and which is incorporated herein in its entirety by reference.

TECHNICAL FIELD

The invention relates to methods and apparatuses for use in a device manufacturing method. More specifically, the invention may relate to methods and apparatuses for metrology in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In the known lithographic apparatus, each substrate to be exposed is loaded on a substrate support (or holder) on which the substrate is supported during the exposure of a patterned beam of radiation. To clamp the substrate on the substrate support a clamping device is provided, which is arranged to provide a clamping force. In a known lithographic apparatus a vacuum clamping device is used as a clamping device. Such a vacuum clamping device provides a vacuum force with which the substrate is clamped on the supporting surface of the substrate support. In the case that a substrate is straight, the substrate will be clamped on the support surface without any substantial internal stresses in the substrate.

However, substrates may not be flat in their free-form (i.e. unclamped) state, but for instance may be warped in a number of shapes, such as a corrugated shape, a cylindrical shape, a dome shape, a saddle form or another shape. This may be caused by the production method used to make the substrate, or by pre- or post-exposure processes to which the substrates are subjected during the manufacture. Examples of these contributors are: etching, thin film deposition, chemical-mechanical planarization and thermal anneal. These processes can introduce stress or stress changes in the thin films on top of the silicon wafers, resulting in significant wafer grid distortions.

When a warped substrate, for instance a dome-shaped substrate, is clamped on a substrate support for instance by means of a vacuum clamp, the substrate may first contact with the substrate support at the outer circumference of the substrate and thereafter over the rest of the surface of the substrate. Due to the clamping force the substrate is forced into a substantially straight form, while the actual clamping starts at the outer circumference of the substrate. As a result stresses may be induced in the substrate when it is clamped on the supporting surface. This results in in-plane distortion (IPD), which if not adequately corrected for in an alignment procedure may have a negative influence on the quality of the integrated circuits through degradation of parameters such as critical dimension and overlay.

Known methods for correcting for IPD require knowledge of the free-form, unclamped wafer shape. At present this is typically achieved by performing an off-line measurement, whereby the substrate is completely removed from the vacuum clamp of the lithographic apparatus and transported to a separate wafer measurement device which directly measures the free-form shape of the wafer. Once the free-form wafer shape has been determined directly in this off-line manner, a physical or computational model (e.g. finite element model) which simulates the material properties of the wafer is then used to predict the IPD for the given wafer shape will which arise when the wafer is clamped back in the lithographic apparatus for the next part of the fabrication process. Once the IPD has been determined the lithographic apparatus can then be configured to apply compensation, thereby preventing significant degradation in the quality of the printed circuit.

Such known methods are however disadvantageous since they require the wafer to be removed (unclamped) from the substrate holder of the lithographic apparatus and transported to a different measurement apparatus each time the free-form wafer shape and hence IPD is to be determined/updated. Each time the wafer is unclamped from the substrate holder there is a risk of damaging the wafer. Further, this increases the production time since the wafer must be fully re-aligned each time it is brought back to the substrate holder of the lithographic apparatus from the off-line measuring apparatus to determine the wafer free-form shape.

SUMMARY

An object of the invention is to enable the free-form wafer shape (alternatively referred to as "free-form geometry") to be determined online, which is to say within the lithographic apparatus without the requirement to un-clamp the wafer and move it to a different measuring apparatus dedicated to a direct, free-form wafer shape determination. A further object of the invention is to utilize the free-form wafer shape which is determined online to predict and correct for in-plane distortion.

According to the invention in an aspect, there is provided a method for reconstructing a free-form geometry of a substrate, the method comprising: positioning the substrate on a substrate holder configured to retain the substrate under a retaining force that deforms the substrate from its free-form geometry; measuring a height map of the deformed substrate; and reconstructing the free-form geometry of the deformed substrate based on an expected deformation of the substrate by the retaining force and the measured height map.

According to the invention in an aspect, there is provided a method for reconstructing a free-form geometry of a substrate, the method comprising: obtaining a height map of the substrate, wherein the height map was measured while the substrate was positioned on a substrate holder configured to retain the substrate under a retaining force deforming the substrate from its free-form geometry; and reconstructing the free-form geometry of the deformed substrate based on an expected deformation of the substrate by the retaining force and the measured height map.

According to the invention in an aspect, there is provided a computer program comprising instructions which, when executed on at least one processor, cause the at least one processor to control an apparatus to carry out a method according to any described herein.

According to the invention in an aspect, there is provided a carrier containing the computer program mentioned above, wherein the carrier is one of an electronic signal, optical signal, radio signal, or non-transitory computer readable storage medium.

The level sensor may be an ultraviolet or visible light interferometric sensor. The level sensor may alternatively be an air gauge.

BRIEF DESCRIPTION OF THE DRAWINGS

Exemplary embodiments are described herein with reference to the accompanying drawings, in which.

DETAILED DESCRIPTION

Before describing the invention in detail, it is instructive to present an example environment in which the present invention may be implemented.

Figure 1:
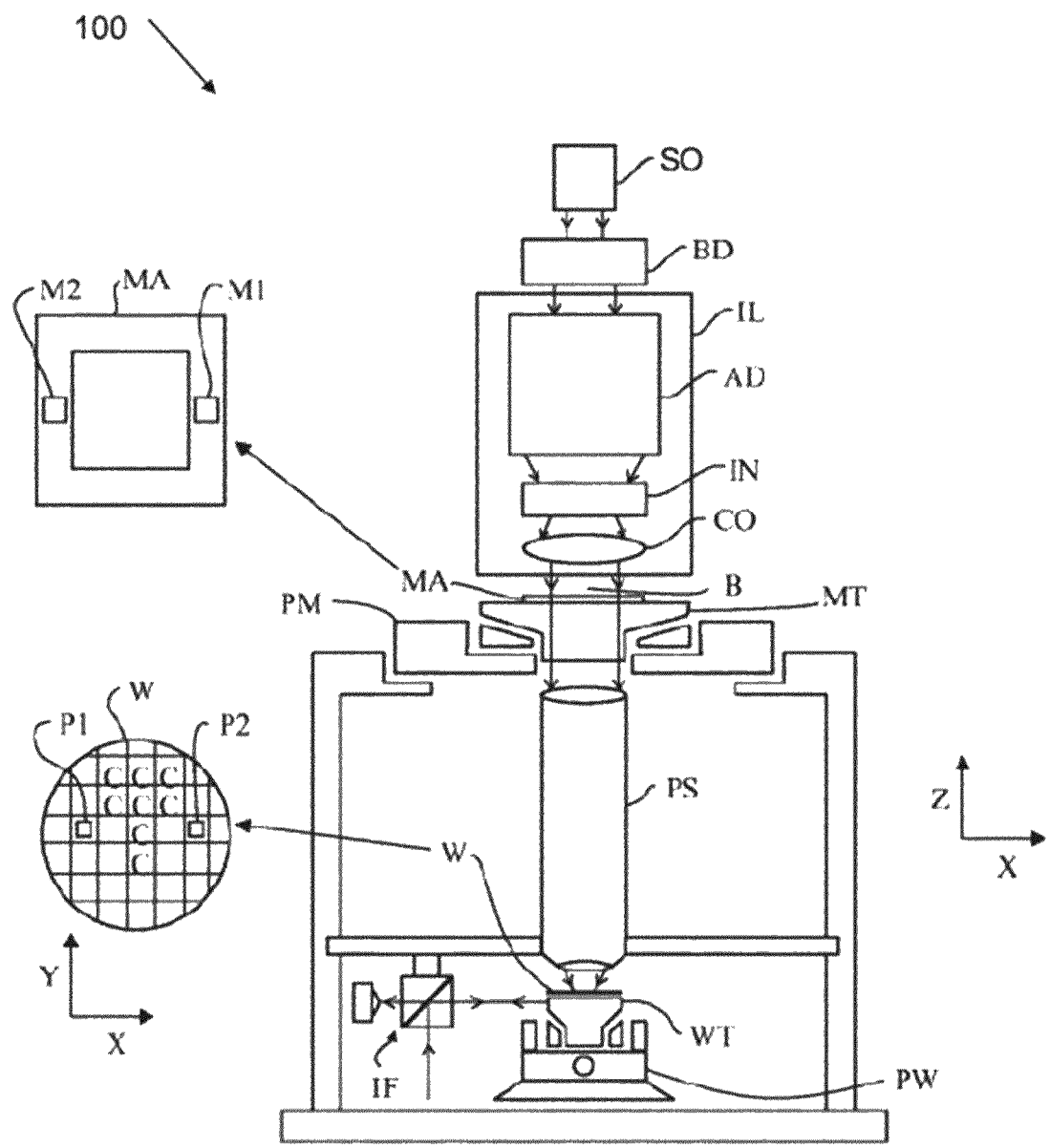
FIG. 1 is a schematic representation of a lithographic apparatus as part of an industrial facility.
Figure 2A:
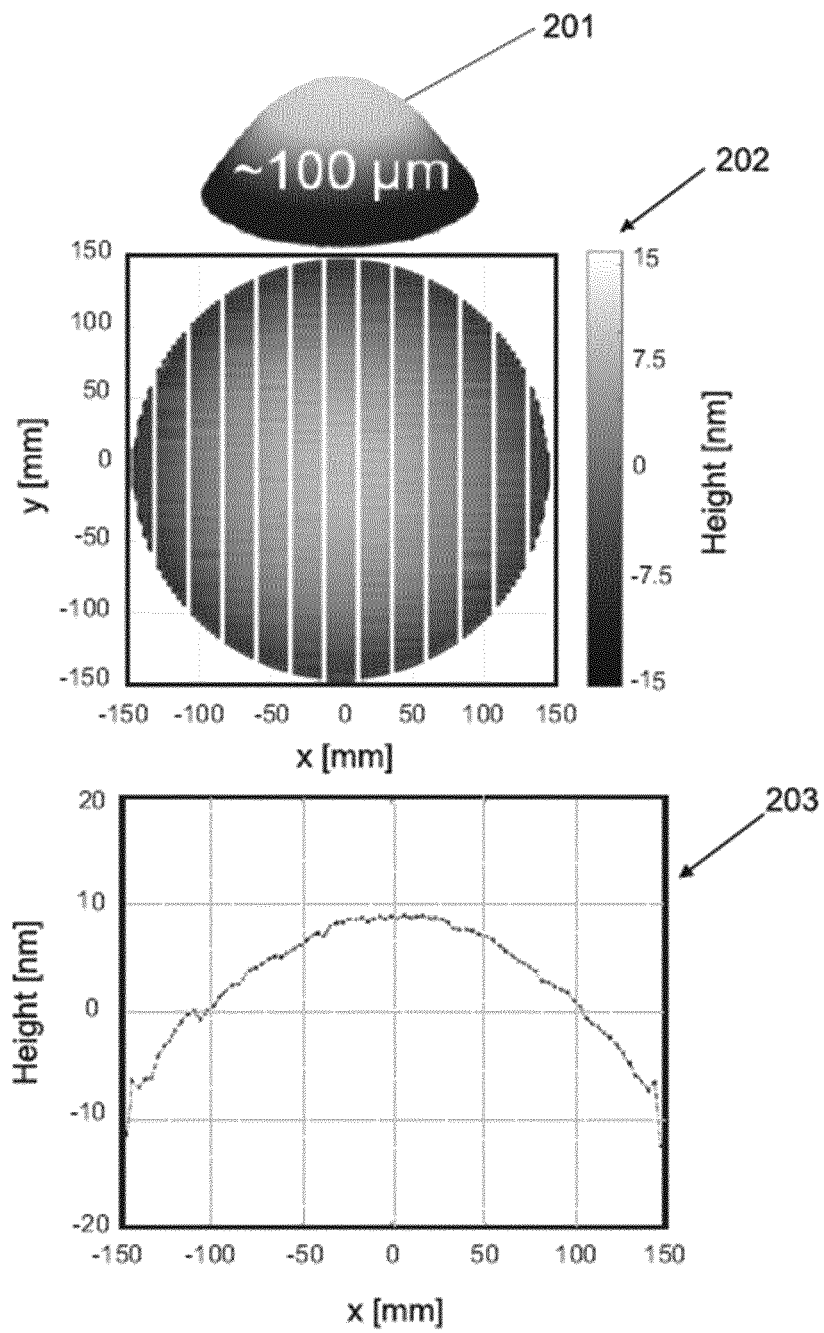
FIGS. 2a to 2d show example measured data corresponding to level maps of wafers which are clamped on the substrate holder of a lithographic apparatus.
Figure 2B:
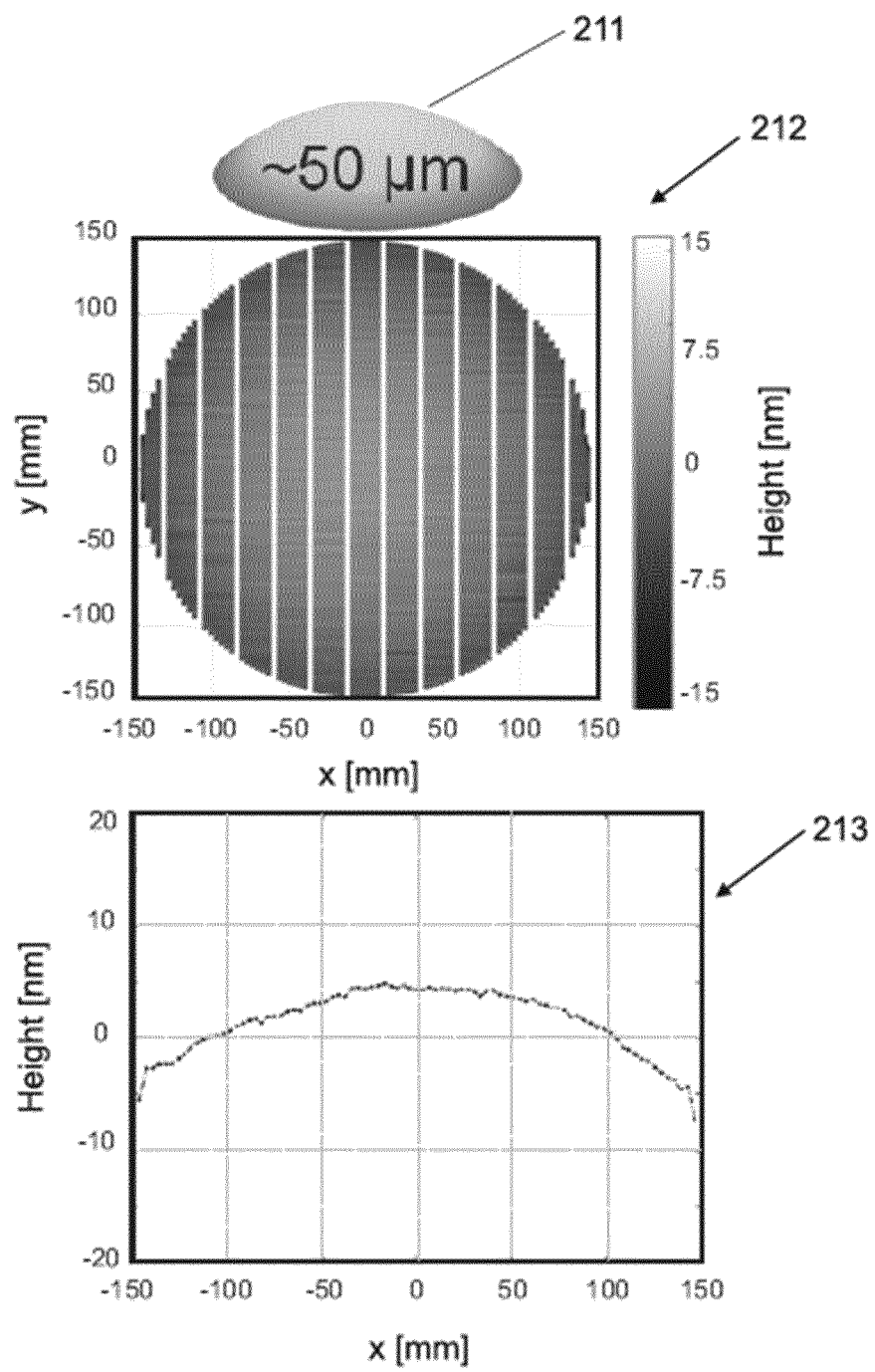
Figure 2C:
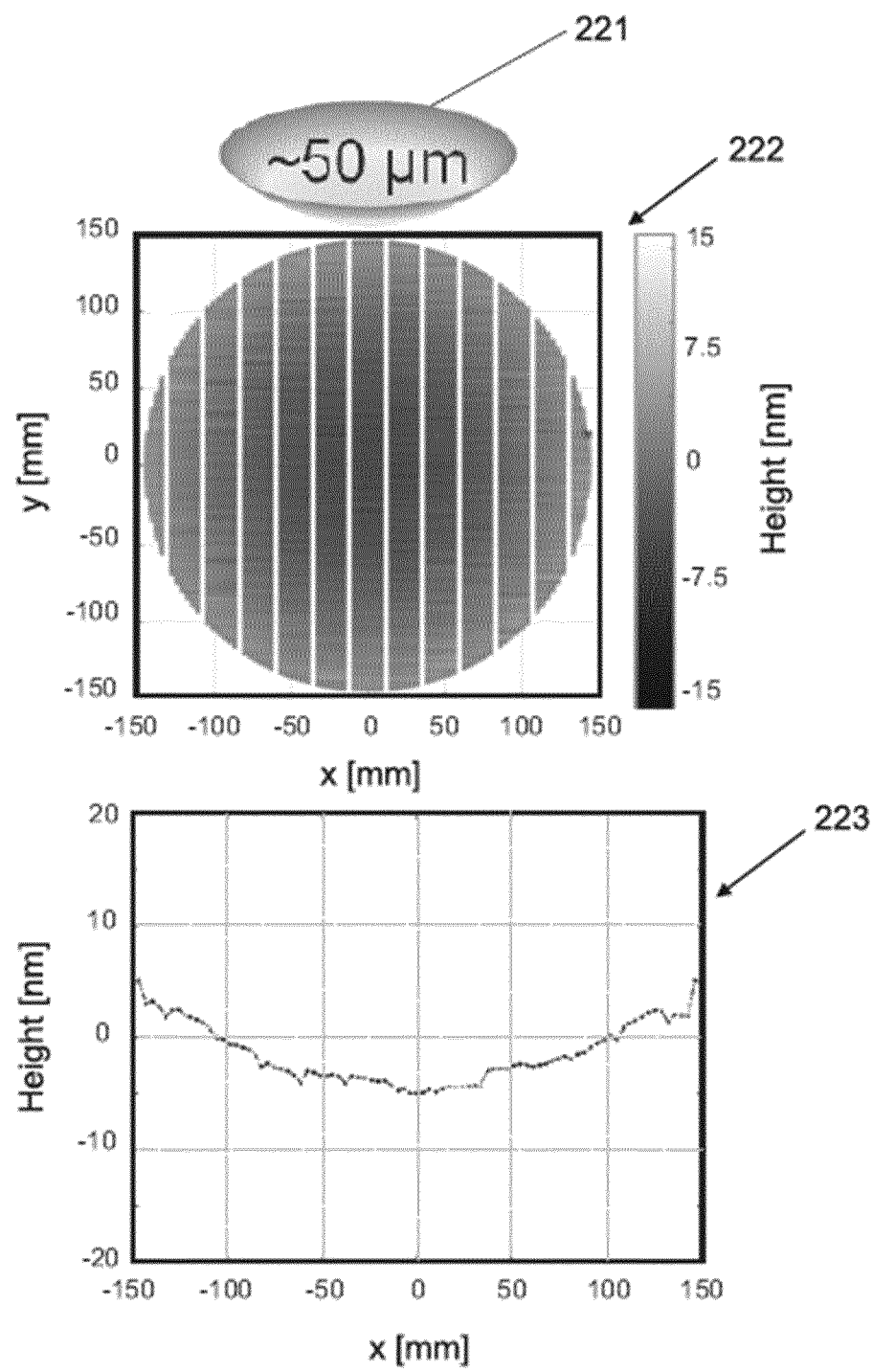
Figure 2D:
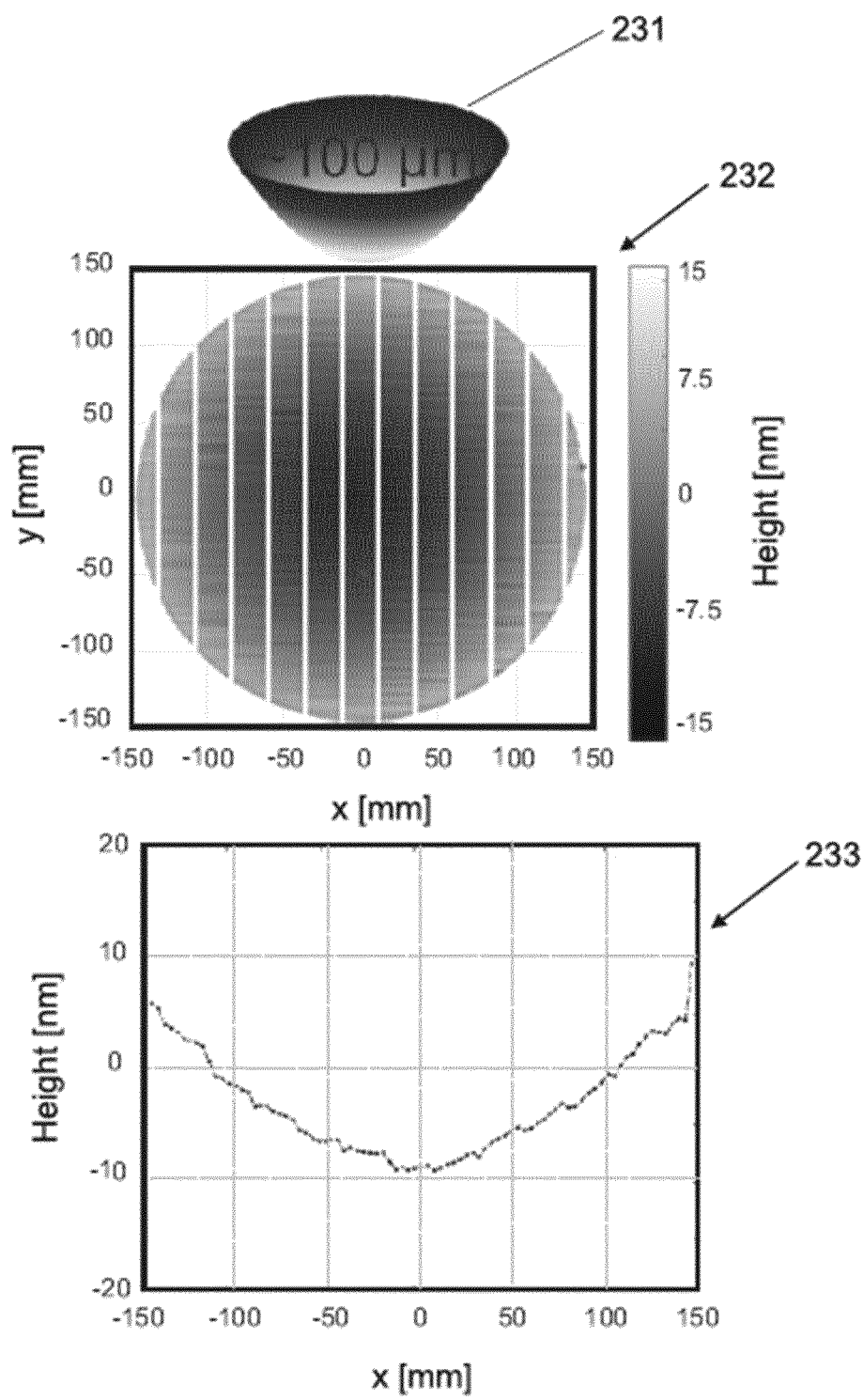

FIG. 1 schematically depicts a lithographic apparatus 100. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate holder (also known as a substrate support, substrate table or substrate holder) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illuminator IL receives a radiation beam from a radiation source SO. The source SO and the illuminator IL, together with the beam delivery system BD if required, may be referred to as a radiation (or optical) system. The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W.

With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan.

In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed.

Before the pattern is applied to a substrate, various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice might measure in detail the positions of many marks across the substrate area, if the apparatus is to print product features at the correct locations with very high accuracy.

In a process generally referred to as "wafer alignment", the patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

Such wafer alignment is typically also sufficient to capture the aforementioned in plane distortion (IPD). However, in order to do so the alignment marks should have sufficient contrast and be free from asymmetry. However, increasingly, carbon- and/or metal-containing hard masks may be applied to the substrate wafer. These masks are substantially opaque to the alignment laser light. Consequently, the inventors have appreciated that it has become challenging to correct for complex, IPD by such alignment techniques. To overcome this, as described above in the background section, off-line free-form wafer shape measurements are typically performed. Based on these measurements and a physical or numerical computational model, the IPD can be predicted and corrected for accordingly.

The inventors have discovered that the free-form wafer shape is not completely flattened out by clamping the wafer on the substrate holder of the lithographic apparatus. In this regard, FIGS. 2a-2d illustrate measured level maps (i.e. height maps of the wafer) 202, 212, 222, 232 recorded using a level sensor of a lithographic apparatus for 4 different wafers having different free-form wafer shapes 201, 211, 221, 231 respectively. According to this example, the level maps correspond to the difference between the level maps measured after and before deposition of a nitride layer on the substrate, by subtracting the level map determined before nitride deposition from the level map determined after nitride deposition. This results in a so-called delta level map. One can observe that a residual shape is apparent in the delta level map which is similar to the free-form wafer shape albeit on a much smaller length scale. For example, in FIG. 2a the warp of the free-form wafer is approximately 100 µm whereas the warp measured in the delta level map, whilst having a similar profile, is on the order of 20 nm. In this context warp is defined as the difference between the maximum and the minimum distances of the median surface of a free, un-clamped wafer from a reference plane defined above the wafer. Further, cross sections 203, 213, 223 and 233 of the delta level maps along the y=0 line clearly bear a close resemblance to the respective free-form wafer shapes.

In exemplary arrangements, the substrate or wafer may be clamped by means of the vacuum clamp provided on the substrate holder of the lithographic apparatus with a clamping force which does not completely flatten out the wafer, such that a residual level map can be measured by the level sensor of the lithographic apparatus. This clamping force may depend on one or more of several factors such as the stiffness of the substrate holder, the level of deformation of the wafer and characteristics of the vacuum clamp. These factors influence the maximum vacuum clamping force which still allows accurate determination of the free-form wafer shape. For example a wafer with a high level of deformation may be subjected to a relatively high clamping force while still a significant residual height map profile will remain. The same applies to a substrate holder having a low stiffness. A wafer may be clamped to such a substrate holder with a high clamping force, which will lead to the substrate holder "following" the height map profile of the wafer, hence a relatively large residual height map profile of the wafer will remain, even when clamping forces are relatively high. It will be understood that the methods described herein are not limited to application in a lithographic apparatus comprising a vacuum clamp, but could also be used in conjunction with a different form of wafer clamp such as an electrostatic clamp/chuck (ESC), for example, where the clamping force is set by means of an applied voltage rather than an applied vacuum force. The term "clamping force" may therefore encompass any force used to hold a substrate to a substrate holder.

Figure 3:
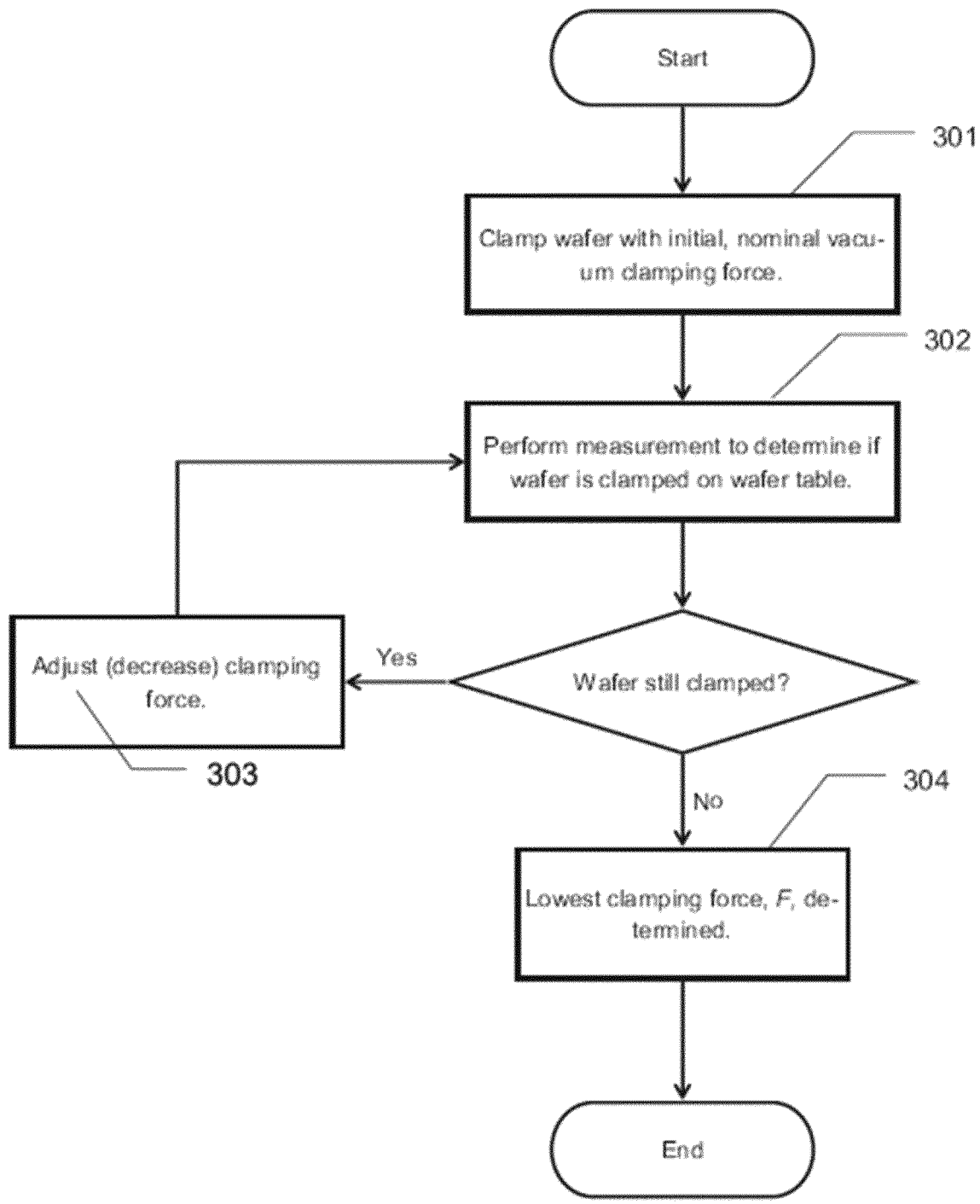
FIG. 3 is a flow chart corresponding to a method for selecting an appropriate clamping force for clamping the wafer on the substrate holder of the lithographic apparatus.

FIG. 3 is a flow chart which illustrates one exemplary method for determining a minimum vacuum clamping force that still clamps the wafer to the substrate holder. Such a minimum clamping force typically does not completely flatten the wafer against the substrate holder. First the wafer is clamped with a standard, nominal clamping force which is known from characteristics of the lithographic apparatus and in particular the vacuum clamp of the substrate holder, 301. Next, in-chuck pressure measurements are performed to assess whether the wafer is still clamped 302. If the wafer is still clamped then the vacuum force is adjusted (decreased) by a set decrement, 303. This process is iterated until the in-chuck pressure measurement determines that the wafer is no longer clamped. This then determines the lowest force, F, that still clamps the wafer on the substrate holder, 304. For example, in the case that the clamping force is decremented by a fixed amount for each iteration of the procedure, one selects the next-highest clamping force from that which first provides an indication from the in-chuck pressure measurement that the wafer is no longer clamped.

The inventors have appreciated that such a lowest clamping force may be desirable for determining the wafer level maps in-situ within the lithographic apparatus in accordance with exemplary arrangements disclosed herein. One reason is that the level sensor will have a limited vertical (height) precision/resolution such that if the wafer is clamped too tightly on the substrate holder the effective signal-to-noise ratio of the level map may be too poor for use in a free-form wafer shape reconstruction. That is, if the wafer is held too flat then the level sensor may not have sufficient sensitivity to determine the level map.

Further, under certain clamping conditions, e.g. a larger clamping force than that determined by the method described above with reference to FIG. 3, the determined level map shape/profile may include a significant contribution which is not directly associated with the free-form wafer shape, but rather which is induced as a result of the clamping itself. This contribution may need to be taken into account during the free-form wafer shape reconstruction or eliminated/suppressed by appropriate choice of the vacuum clamping force. Since the above method for choosing the clamping force also reduces the clamping force it is anticipated that the distortion resulting from the clamping itself will be reduced.

In another aspect of the invention the clamping force conditioning according to FIG. 3 is not needed as the wafer is not loaded on a surface of the substrate holder, but still resting on the ejector pins of (also known as lift pins or e-pins) of the substrate holder. The ejector pins are typically used to accept a wafer delivered by a wafer handler module, and lowered through the surface of the substrate holder in order to put the wafer on the surface of the substrate holder. Typically when the wafer is accepted by the ejector pins of the substrate holder it rests on three spatially separated contact points, in close proximity to the surface of the substrate holder. At this stage the wafer is mainly subject to a gravitational force, the gravitational force being proportional to the mass of the wafer. The deformation of the wafer due to this gravitational force is however expected and can be modelled. Measuring a height map of the wafer, while positioned on the ejector pins, then allows reconstructing of the free-form geometry of a substrate by subtracting the expected deformation of the substrate (wafer) from the measured height map. In an embodiment a method for reconstructing of the free-form geometry of a substrate is defined, the method comprising: positioning the substrate on a substrate holder configured to retain the substrate under a retaining force that deforms the substrate from its free-form geometry; measuring a height map of the deformed substrate; and reconstructing the free-form geometry of the deformed substrate based on an expected deformation of the substrate by the retaining force and the measured height map. The retaining force may be present due to gravitational forces (wafer resting on ejector pins) or due to an adapted (low) clamping force as determined using a method according to FIG. 3. Subsequent to the method of FIG. 3 a further method is utilized comprising controlling the clamping force to impart the expected deformation of the substrate based on a characteristic of the substrate, and measuring a height map of the deformed substrate with the substrate subject to the controlled clamping force.

A number of different methods for reconstructing the free-form geometry of the deformed substrate will now be described with reference to FIGS. 4 to 7. In all exemplary methods, the deformed substrate is first positioned on the substrate holder, which is configured to fix the substrate using a clamping force, such as a vacuum clamping force. The clamping force is then controlled based on first and/or second characteristics. The first characteristic is associated with the substrate holder and may comprise a stiffness property of the substrate holder. The second characteristic may be any of: an expected magnitude of the deformation of the deformed substrate; a stiffness property of the deformed substrate; and a context of the deformed substrate. The context of the deformed substrate may comprise information relating to the material of the wafer, the properties of the layers applied to the wafer or any other information which relates to deformation characteristics of a substrate when subjected to a clamping force. A height map of the substrate when subjected to the controlled clamping force is then measured and the geometry of the substrate reconstructed from the measured height map. FIGS. 4-7 are explained below and give specific exemplary methods.

Figure 4:
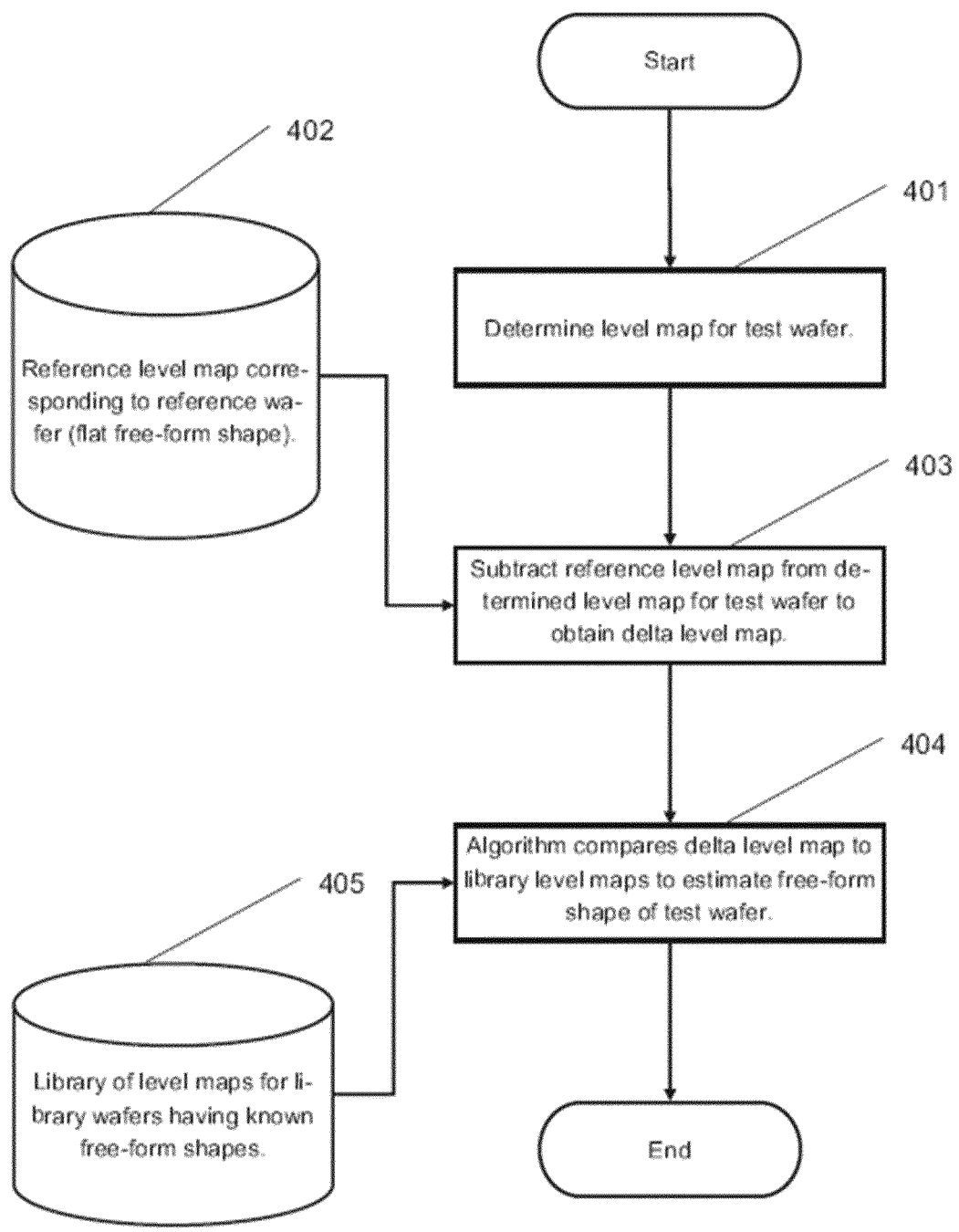
FIGS. 4 to 7 are flow charts corresponding to methods for reconstructing the free-form wafer shape from measurements performed with the wafer clamped on the substrate holder of the lithographic apparatus.

FIG. 4 illustrates a method for reconstructing the geometry (i.e. free-form shape) of a deformed wafer substrate according to one exemplary method. After being positioned on the substrate holder and clamped using the controlled clamping force, a level map is determined 401 for the wafer whose unknown free-form shape is to be determined, hereinafter referred to as the "test wafer". The level map may be determined by performing measurements using a level sensor of the lithographic apparatus. The test wafer is clamped at a clamping force lower than the standard, nominal clamping force, e.g. the wafer is clamped at a clamping force as determined according to the method described above with reference to FIG. 3. Therefore, the substrate is clamped to the substrate holder, but is allowed to return, at least partially (e.g. partially in magnitude), to its free form geometry or something resembling it and from which the free form geometry may be determined.

Additionally, a reference level map is determined for at least one wafer having a known free-form shape, hereinafter referred to as a "reference wafer". Preferably the reference wafer is substantially flat in the free-form state, e.g. it may be an unprocessed wafer. The reference wafer is clamped in the same or a corresponding lithographic apparatus with substantially the same controlled clamping force as was used when determining the level map of the test wafer. As such, given that the reference wafer is substantially flat in the free-form state, the reference level map is indicative of other factors such as the stiffness of the substrate holder. According to this embodiment, the reference wafer level map has been determined in advance and stored in a storage medium, such as a magnetic disk, 402. In this manner, the test wafer need not be unclamped and switched with the reference wafer each time the test wafer shape reconstruction is to be performed. For example, a reference level map for the reference wafer may be determined at the beginning of each production cycle, day, or within such a timeframe that other parameters of the lithographic apparatus remain substantially unchanged. The free-form shape of the reference wafer is preferably flat, as verified independently, for example by directly measuring it using an appropriate apparatus and method with the reference wafer unclamped, i.e. in a free-form state. The skilled person would know how to perform such a measurement of the reference wafer free-form shape in the unclamped state and therefore details are not provided here.

The reference level map is subtracted 403 from the level map determined for the test wafer to determine a delta level map. In this manner, various factors which may negatively influence the correspondence between the level map determined for the test wafer and the free-form test wafer shape are calibrated out. Such factors include, for example, the shape of the substrate holder which is partially imparted onto the wafer shape and hence the determined level map when the wafer is clamped on the substrate holder of the lithographic apparatus. The level map which results when the reference level map is subtracted from the level map determined for the test wafer is referred to herein as a "delta level map".

Once determined, the delta level map is fed 404 into an algorithm which performs a comparison between the determined delta level map and a library of level maps 405 corresponding to a plurality of "library wafers". The level maps of the library wafers may have been measured a priori at a similar or the same controlled clamping force at which the test wafer level map was determined. The library level maps may also be delta level maps that have been corrected for factors such as the substrate holder shape by subtracting the reference level map as described above with reference to the test wafer. Further, the free-form shapes of the library wafers are also known from off-line measurements in a manner which would be known to one skilled in the art.

The algorithm may first compute the warp level of the delta level map (effectively the vertical extent between the highest point of the delta level map and lowest point of the delta level map) of the test wafer. This warp level is then compared against the warp levels for each of the library level maps. The library wafer corresponding to a level map with the most similar, i.e. closest, warp level to that of the delta level map of the test wafer is then selected. For example, suppose the warp level of the delta level map for the test wafer is 22 nm and the library level maps have warp levels of {10 nm; 15 nm; 20 nm; 25 nm; and 30 nm} then, according to this example, the library level map with the most similar warp level is the third one, i.e. that having a warp level of 20 nm. The free form geometry of the test wafer may then be determined based on the free form geometry of the library wafer corresponding to the library level map having a warp level of 20 nm.

Since the free-form shape and hence also the warp level of the selected library wafer is known, it is possible to calculate scale factor which when applied to the warp level of the selected library wafer level map determines the warp level of the selected library wafer in the unclamped, free-form state. For instance, as in the example above, the selected library wafer has a warp level of 20 nm in the clamped state (as determined from the level map) and, for example, a warp level of 100 µm in the unclamped state (determined from off-line measurement). Then, according to this example, the (dimensionless) scale factor is 100/0.020=5000.

The scale factor, determined for example as above, can then be applied to the warp level of the delta level map of the test wafer to obtain an estimate of the warp level of the test wafer in the unclamped state. For example, as above the warp level of the delta level map for the test wafer is 22 nm. Then applying the scale factor of 5000 provides an estimate of 110 µm for the warp level of the test wafer in the unclamped state. The quality of the estimate will be improved by increasing the number of library wafers and controlling conditions such that the library wafer level maps were measured under similar conditions to that of the reference wafer and the test wafer.

It is anticipated that, owing to the complex nature of the clamping process, the scale factor will not be constant for different free-form wafer shapes but will scale non-linearly with e.g. wafer warp. Further, the scale factor may also be a function of the wafer shape in the free-form state.

Alternatively, the algorithm may perform a least squares fit to determine a set of coefficients and an overall scale factor which minimizes a residual between the determined delta level map of the test wafer and a linear combination of the library level maps. In this manner, once the optimal or best-fit set of coefficients and scale factor have been determined, an estimate of the free-form wafer shape can also be determined by taking a linear combination of the library wafer free form shapes.

The free-form wafer shape may further be used to identify locations on the wafer which are likely to comprise defect structures after subsequent processing. For example locations on the wafer associated with a large amplitude of the free-form wafer shape from a nominal flat are more likely to demonstrate defects as the clamping induced in-plane deviation at these locations will have a high likelihood of causing overlay errors.

In addition to, or instead of the height map measurement data also alignment measurement data comprising positions of alignment markers on the wafer may be used to determine the free-form geometry. For example a wafer clamped by a certain controlled clamping force may also be subject to measurements of the alignment system. These measurements are indicative of the IPD of the wafer and hence may be used to verify or modify the determined free-form geometry based on the height map measurements.

The free-form wafer shape may further be used to modify a model used for wafer alignment purposes. The free-form wafer shape is indicative of a certain fingerprint of the IPD of the wafer after clamping of the wafer. Based on the calculated IPD fingerprint an alignment model (for example a model to which alignment measurements across the wafer are fitted) may be modified or determined. In addition further operational parameters of the alignment system may be selected (for example which wavelength to select).

The free-form wafer shape may further be classified based on the properties of the free-form wafer shape. For example a wafer may be classified as one or more of the following: convex, concave, substantially flat, saddle shaped and the like. Alternatively classification may be implemented by comparing the determined free-form wafer shape to a library of wafer shapes, for example based on previously measured or modelled free-form wafer shapes.

Based on the classification a wafer dedicated process correction (for example a correction to the settings of the lithographic apparatus targeted to optimize the overlay between layers on the wafer) may be determined and used during subsequent processing steps (lithography, etching, deposition, Chemo Mechanical Polishing (CMP)). Alternatively the determined free-form wafer shape may be used directly to determine a wafer dedicated process correction.

Figure 5:
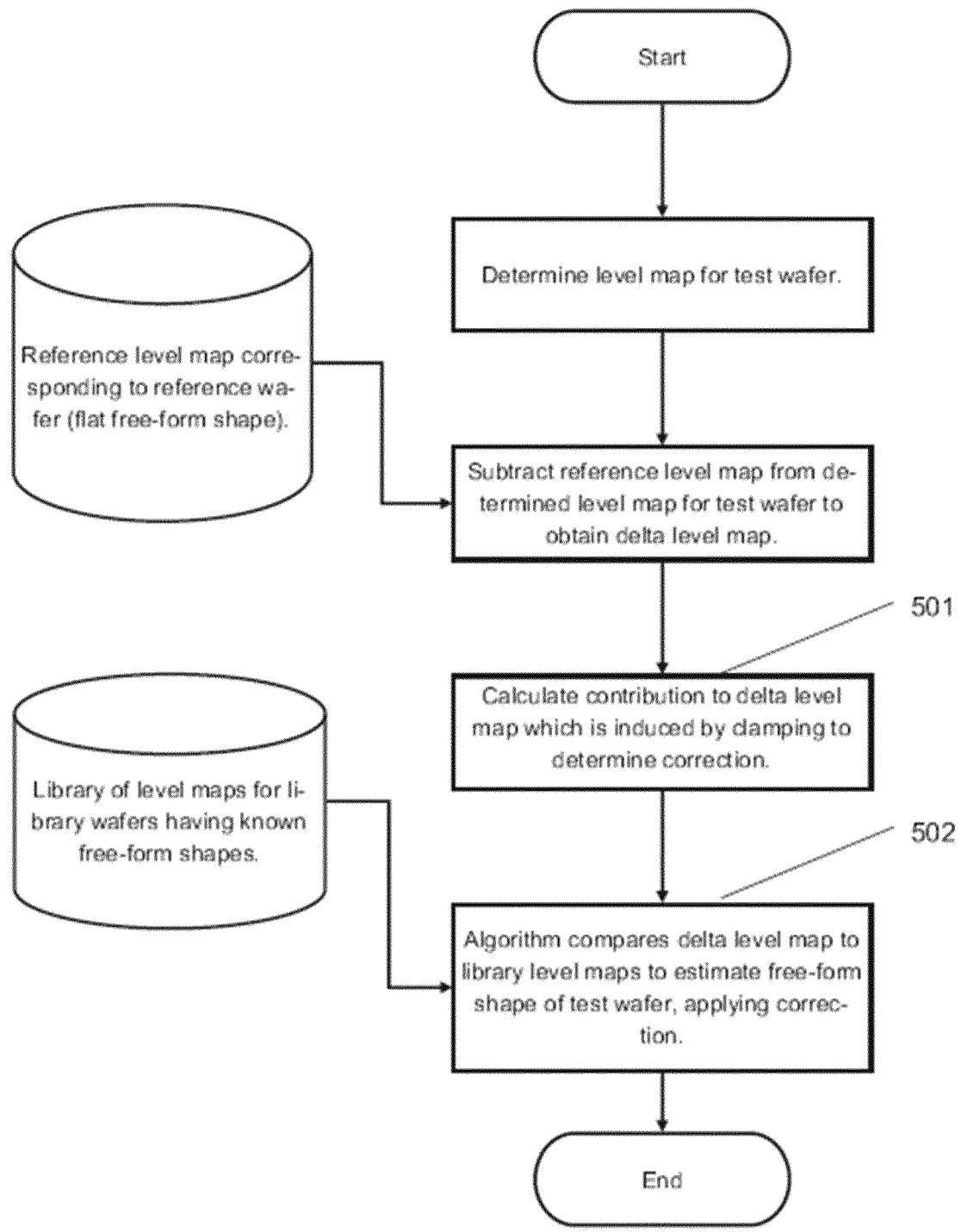

FIG. 5 illustrates a method for reconstructing the free-form shape of a deformed wafer substrate according to another exemplary arrangement. The delta level map is determined in the same manner as described above with reference to FIG. 4, details of which are not repeated here. According to this arrangement, the estimate of the free-form wafer shape for the test wafer may be improved by using a finite element method (FEM) model of the wafer to calculate 501 the contribution to the delta level map which is induced by the clamping itself. This contribution is not indicative of the free-form wafer shape and can be accounted for in order to improve the estimate of the free-form shape of the test wafer. For example, the algorithm may account for the contribution by applying 502 a correction factor to the scale factor described above with reference to FIG. 4. Alternatively, the correction may be applied directly to the delta level map.

Figure 6:
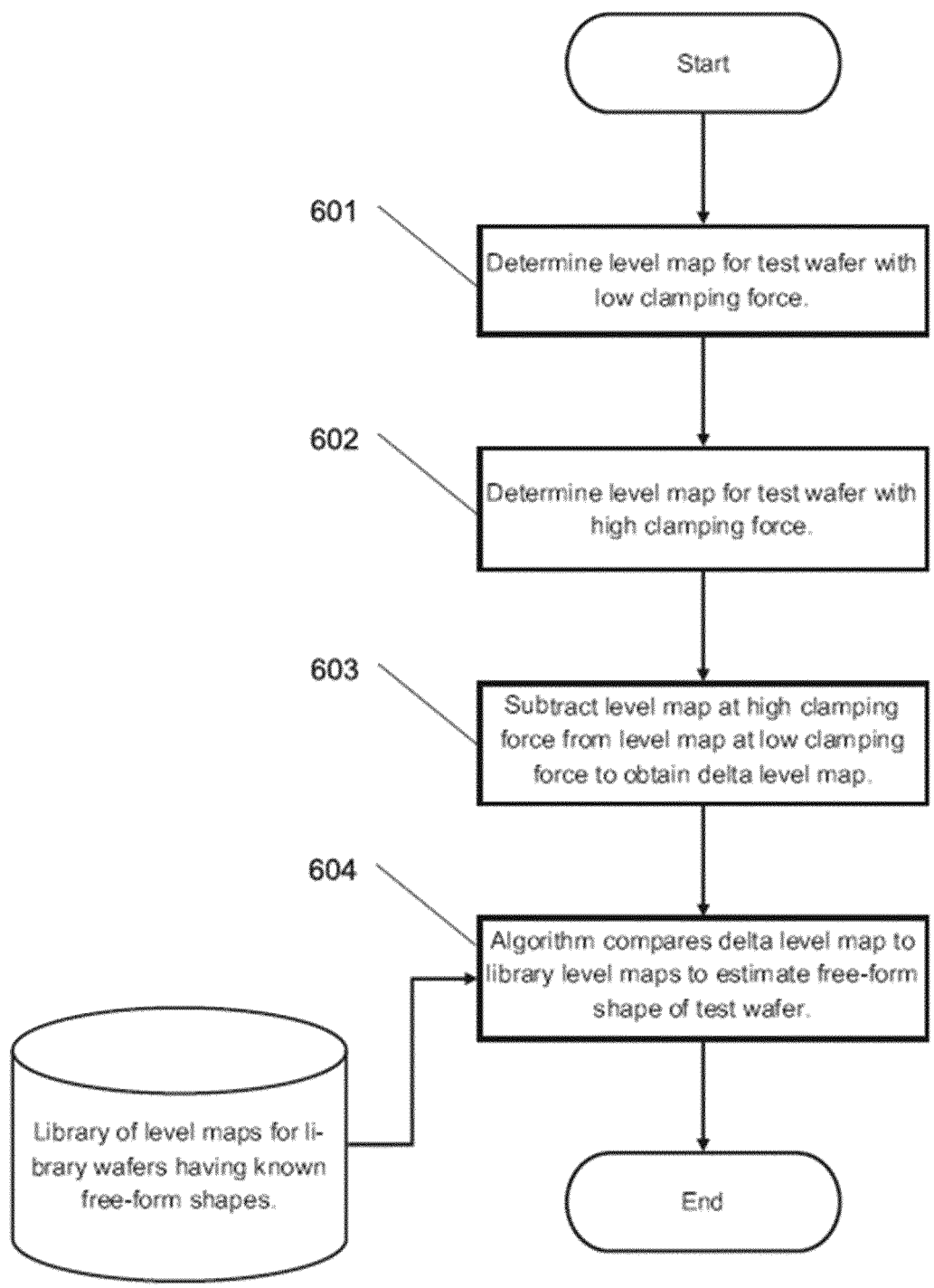

FIG. 6 illustrates a method for reconstructing the free-form shape of a deformed wafer substrate according to another embodiment of the invention. First, a level map is determined 601 for the test wafer with the test wafer clamped at a controlled clamping force, lower than the standard, nominal clamping force used in an ordinary lithographic process. The level map is determined by performing measurements using a level sensor of the lithographic apparatus. The low clamping force may be determined according to the method described above with reference to FIG. 3. Next, a level map is determined 602 for the test wafer with the test wafer clamped at a high clamping force, such as the standard, nominal clamping force. The high clamping force may be such that the test wafer is clamped substantially flat on the substrate holder of the lithographic apparatus. Next, the level map which is determined for the high clamping force is subtracted 603 from the level map determined with the wafer clamped at a low clamping force to obtain a delta level map. In this manner the shape of the substrate holder, and other constant factors, may be calibrated out. Next, the delta level map is fed into an algorithm 604 which enables the free-form shape of the test wafer shape to be estimated. The algorithm operates in the same or a similar manner as that described with reference to FIG. 4.

Figure 7:
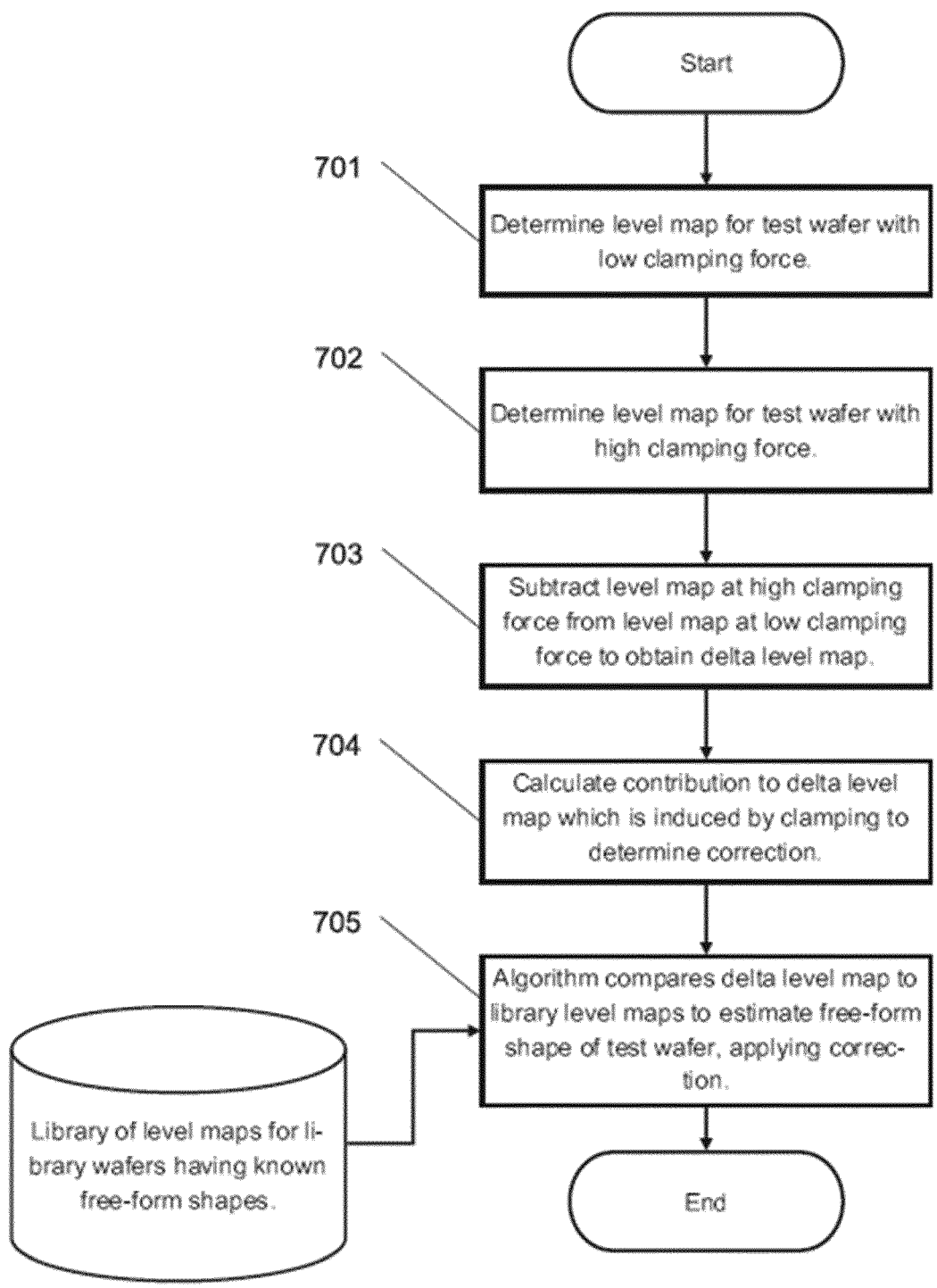

FIG. 7 illustrates a method for reconstructing the free-form shape of a deformed wafer substrate according to another exemplary arrangement similar to that described with reference to FIGS. 5 and 6. As in other arrangements, a level map is determined 701 for the test wafer with the test wafer clamped at a low, controlled clamping force. The level map may be determined by performing measurements using a level sensor of the lithographic apparatus. The low clamping force may be determined according to the method described above with reference to FIG. 3. A level map is determined 702 for the test wafer with the test wafer clamped at a high clamping force, such as the nominal clamping force. The high clamping force may be such that the test wafer is clamped substantially flat on the substrate holder of the lithographic apparatus. The level map, which is determined for the high clamping force, is subtracted 703 from the level map determined with the wafer clamped at a low clamping force to obtain a delta level map. In this manner the shape of the substrate holder, and other constant factors, may be calibrated out. As with the arrangement described above with reference to FIG. 5, the estimate of the free-form wafer shape for the test wafer is improved by using a finite element method (FEM) model of the wafer to calculate 704 the contribution to the delta level map which is induced by the clamping itself and thereby to determine a corrected delta level map. The corrected delta level map is fed into an algorithm 705 which enables the free-form shape of the test wafer shape to be estimated. The algorithm accounts for the contribution induced by the clamping by applying a correction factor the scale factor as described above with reference to FIGS. 4 and 5.

Whilst the methods described above with reference to FIGS. 4 to 7 enable the free-form wafer shape to be determined with the test wafer in situ within the lithographic apparatus, using the level sensor for example, the inventors have also appreciated that a separate metrology tool which is used to monitor parameters such as critical dimension and overlay can also be used to determine the free-form wafer shape. In such a separate metrology tool the wafer itself may still be clamped on a substrate holder by means of a vacuum clamp. As such, aspects of the methods described above can be used to determine the free-form wafer shape without having the unclamp the wafer from the substrate holder of the metrology apparatus, which would add additional time and complexity to the overall metrology process and also increase the risk of damaging the wafer or introducing alignment errors.

Recently, various forms of optical tools or scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Such metrology devices include a focussing controller to ensure that the targets are measured in focus. The inventors have appreciated that this focus controller can be used to measure the wafer level map as no specific targets are required to determine the best focus, i.e. the focus measurement can be performed at any location on the wafer. The wafer level map could alternatively be determined in such a metrology tool by processing the size, position and angular spread of the scattered light observed in the pupil plane. In other words, the inventors appreciate that if, according to a particular arrangement, the test wafer is to be periodically moved to a separate metrology tool for assessment of parameters such as critical dimension and overlay, at this stage in the fabrication process it would also be desirable to be able to measure a level map of the test wafer in the clamped state from which the free-form shape of the test wafer and hence induced in-plane distortions can be determined. Again, this becomes particularly prescient in situations where a standard alignment may not be possible owing to the deposition of masks which diminish the contrast of the alignment targets, or where alignment targets are used which lack the requisite symmetry to make a direct determination of the in-plane distortion.

For one or more of the embodiments described above, it should be appreciated that the delta level map is substantially free from level sensor wafer processing and topography effects. This is due to the subtraction of either a reference level map obtained from a reference wafer or a level map obtained from the test wafer under a high clamping force, such that it is substantially flat and only factors relating to the shape of the substrate holder remain. Further, the above-described methods are independent of the type of level sensor employed within the lithographic apparatus. Known level sensors include ultraviolet and visible light interferometric sensors and air gauges, for example. Further, the above-described methods are largely independent of the calibration state of the level sensor. In addition, the common substrate holder shape is also suppressed from the delta level map. The inventors have appreciated that the contribution to the delta level map caused by the clamping manifests itself primarily in a xy displacement, i.e. a displacement in the plane of the substrate holder/wafer. Since the z (i.e. height) information from the delta level map is used in the wafer shape reconstruction, it is likely to be less sensitive to clamping. The primary contribution to the delta level map is therefore that which arises from the free-form wafer shape itself. In other words, methods as described herein inherently suppress or reduce signals which are not directly indicative of the free-form wafer shape. Further, the methods are self-calibrating by virtue of the use of a delta level map.

For all the embodiments described above the test wafer shape, e.g. a test wafer shape change induced by stress, can be derived from measurements using metrology systems of the lithographic apparatus, e.g. the scanner level sensor. Further, this can be done whilst the wafer is still resting on the ejector pins (also known as lift pins or e-pins) of the substrate holder. It is not necessary to remove the wafer from the substrate holder and transport it to a separate metrology apparatus in order to determine the free-form wafer shape. Further, in the above-described embodiments, since the delta level map is used, the wafer processing contribution and other calibration factors are automatically factored out. The methods described above can be used to determine the free-form wager shape at different stages of the production process, for example, before and after deposition of a stress-inducing film. As such, the change in the free-form wafer shape resulting from different processing steps can be derived. This enables the resulting in-plane distortion to be updated and corrected for to ensure quality control of parameters such as overlap and critical dimension. Further, the derived change in the free-form wafer shape can be used to actually determine the amount of stress which has been induced in the wafer by the process, e.g. film deposition or thermal anneal. Further, if information pertaining to the determined free-form wafer shape is combined with circuit layout information, local distortion within the wafer can be predicted. Wafer distortion feed forward models can be built in analogy with free-form wafer shape measurements. Wafer distortion feed forward models can be built in analogy with for instance reticle heating. Instead of using the local temperature as a source of the distortion, the scanner stress measurement can be used.

It is to be understood that although in the embodiments described above a reference level map is subtracted from the level map determined for the test wafer; the reconstruction could in principle also be performed without subtracting a reference level map. For example, if the particular substrate holder of the lithographic apparatus in question does not impart a significant shape or other distortion onto the wafer when in the clamped state than no such subtraction may be necessary. In this case the delta level map as referred to in the above-described embodiments is replaced by the level map determined for the test wafer in the clamped state. However, the subtraction of a reference level map to obtain a delta level map which is subsequently used in the reconstruction of the test wafer shape is likely to result in a more accurate estimation of the free-form shape of the test wafer.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to control an apparatus to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus control an apparatus to provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

Further embodiments of the invention are disclosed in the list of numbered embodiments below: 1. A method for reconstructing a free-form geometry of a substrate, the method comprising:

positioning the substrate on a substrate holder configured to retain the substrate under a retaining force that deforms the substrate from its free-form geometry;

measuring a height map of the deformed substrate; and reconstructing the free-form geometry of the deformed substrate based on an expected deformation of the substrate by the retaining force and the measured height map.

2. The method of embodiment 1, wherein the retaining force comprises a clamping force, the method further comprising controlling the clamping force to impart the expected deformation of the substrate based on a characteristic of the substrate, and wherein the step of measuring a height map of the deformed substrate is performed with the substrate subject to the controlled clamping force.

3. The method of embodiment 1, wherein a level sensor within a lithographic apparatus is used to measure the height map and the substrate holder is located within the lithographic apparatus.

4. The method of embodiment 2, wherein the clamping force is further controlled based on a stiffness property of the substrate holder.

5. The method of embodiment 2, wherein the characteristic of the substrate comprises any of: the expected magnitude of the deformation of the deformed substrate, a stiffness property of the substrate, and a context of the substrate.

6. The method of embodiment 1, further comprising a step of using the reconstructed free-form geometry of the substrate to predict an in-plane deformation of the substrate subject to a clamping force used for processing of the substrate.

7. The method of embodiment 1, further comprising a step of using the reconstructed free-form geometry to classify the substrate.

8. The method of embodiment 6, further comprising a step of updating an alignment model for processing the substrate based on the predicted in-plane deformation of the substrate.

9. The method of embodiment 6, further comprising a step of determining a location on the deformed substrate having a higher probability of a defect based on the in-plane deformation of the substrate.

10. The method of embodiment 1, wherein the step of reconstructing the free-form geometry of the substrate further comprises subtracting a reference height map associated with a geometry of the substrate holder from the measured height map.

11. The method of embodiment 1, further comprising measuring a plurality of height maps at a plurality of retaining forces, and wherein the step of reconstructing the free-form geometry of the substrate is further based on the plurality of measured height maps.

12. The method of embodiment 1, wherein the step of reconstructing the geometry of the substrate is further based on position information of alignment markers.

13. The method of embodiment 1, wherein the step of reconstructing the geometry of the substrate is further based on context information of the deformed substrate.

14. The method of embodiment 1, wherein the substrate holder comprises a one or more ejector pins, and wherein the retaining force comprises a gravitational force of the substrate resting on the one or more ejector pins.

15. A method for reconstructing a free-form geometry of a substrate, the method comprising:

measuring a first height map of the substrate using a level sensor, wherein the substrate is subject to a first retaining force retaining the substrate on a substrate holder and imparting a first deformation on the substrate;

measuring a second height map of the substrate using the level sensor, wherein the substrate is subject to a second retaining force retaining the substrate on the substrate holder and imparting a second deformation on the substrate; and reconstructing the free-form geometry of the substrate based on the first and the second height maps.

16. A computer program comprising instructions which, when executed on at least one processor, cause the at least one processor to control an apparatus to carry out a method according to any one of the preceding embodiments.

17. A carrier containing the computer program according to embodiment 15, wherein the carrier is one of an electronic signal, optical signal, radio signal, or non-transitory computer readable storage medium.

18. An apparatus for reconstructing a free-form geometry of a substrate, the apparatus comprising a processor configured to undertake the steps of:

positioning the substrate on a substrate holder configured to retain the substrate under a retaining force that deforms the substrate from its free-form geometry;

measuring a height map of the deformed substrate; and reconstructing the free-form geometry of the deformed substrate based on an expected deformation of the substrate by the retaining force and the measured height map.

19. An inspection apparatus comprising the apparatus of embodiment 18.

20. The inspection apparatus of embodiment 19, wherein the inspection apparatus is a metrology apparatus.

21. A lithographic apparatus comprising an apparatus according to embodiment 18.

22. A lithographic cell comprising an apparatus according to any one of the embodiments 18 to 20.

23. A method for reconstructing a free-form geometry of a substrate, the method comprising: obtaining a height map of the substrate, wherein the height map was measured while the substrate was positioned on a substrate holder configured to retain the substrate under a retaining force deforming the substrate from its free-form geometry; and reconstructing the free-form geometry of the deformed substrate based on an expected deformation of the substrate by the retaining force and the measured height map.

24. The method of embodiment 23, further comprising a step of using the reconstructed free-form geometry of the substrate to predict an in-plane deformation of the substrate subject to a clamping force used for processing of the substrate.

25. The method of embodiment 23, further comprising a step of using the reconstructed free-form geometry to classify the substrate.

26. The method of embodiment 24, further comprising a step of updating an alignment model for processing the substrate based on the predicted in-plane deformation of the substrate.

27. The method of embodiment 24, further comprising a step of determining a location on the deformed substrate having a higher probability of a defect based on the in-plane deformation of the substrate.

28. The method of embodiment 23, wherein the step of reconstructing the free-form geometry of the substrate is further based on position information of alignment markers.

29. The method of embodiment 23, wherein the step of reconstructing the geometry of the substrate is further based on context information of the deformed substrate.

30. The method of embodiment 23, further comprising a step of controlling a subsequent processing step based on the free-form geometry of the substrate.

The skilled person will be able to envisage other embodiments without departing from the scope of the appended claims.

The invention claimed is:

1. A method for reconstructing a free-form geometry of a substrate, the method comprising:

positioning the substrate on a substrate holder configured to retain the substrate under a retaining force that deforms the substrate from its free-form geometry;

measuring a height map of the deformed substrate; and reconstructing the free-form geometry of the deformed substrate based on an expected deformation of the substrate by the retaining force and the measured height map, the free-form geometry being that of the substrate prior to being positioned in contact with the substrate holder.

2. The method of claim 1, wherein the retaining force comprises a clamping force, wherein the method further comprises controlling the clamping force to impart the expected deformation of the substrate based on a characteristic of the substrate, and wherein the measuring a height map of the deformed substrate is performed with the substrate subject to the controlled clamping force.

3. The method of claim 2, wherein the clamping force is further controlled based on a stiffness property of the substrate holder.

4. The method of claim 2, wherein the characteristic of the substrate comprises any of: an expected magnitude of the deformation of the deformed substrate, a stiffness property of the substrate, or a context of the substrate.

5. The method of claim 1, wherein a level sensor within a lithographic apparatus is used to measure the height map and the substrate holder is located within the lithographic apparatus.

6. The method of claim 1, further comprising measuring a plurality of height maps at a plurality of retaining forces, and wherein the reconstructing the free-form geometry of the substrate is further based on the plurality of measured height maps.

7. The method of claim 1, further comprising using the reconstructed free-form geometry of the substrate to predict an in-plane deformation of the substrate subject to a clamping force used for processing of the substrate.

8. The method of claim 7, further comprising updating an alignment model for processing the substrate based on the predicted in-plane deformation of the substrate.

9. The method of claim 7, further comprising determining a location on the deformed substrate having a higher probability of a defect based on the in-plane deformation of the substrate.

10. The method of claim 1, further comprising using the reconstructed free-form geometry to classify the substrate.

11. The method of claim 1, wherein the reconstructing the free-form geometry of the substrate is further based on position information of alignment markers.

12. The method of claim 1, wherein the reconstructing the geometry of the substrate is further based on context information of the deformed substrate.

13. The method of claim 1, further comprising controlling a subsequent processing step based on the free-form geometry of the substrate.

14. The method of claim 1, wherein the reconstructing the free-form geometry of the substrate further comprises subtracting a reference height map associated with a geometry of the substrate holder from the measured height map.

15. The method of claim 1, wherein the substrate holder comprises one or more ejector pins, and wherein the retaining force comprises a gravitational force of the substrate resting on the one or more ejector pins.

16. A computer program product comprising a non-transitory computer-readable medium having instructions therein, the instructions, when executed by a processor system, configured to cause the processor system to at least:

obtain a height map of a substrate deformed from a free-form geometry of the substrate, wherein the height map was measured while the substrate was positioned on a substrate holder configured to retain the substrate under a retaining force deforming the substrate from its free-form geometry; and reconstruct the free-form geometry of the deformed substrate based on an expected deformation of the substrate by the retaining force and the measured height map, the free-form geometry being that of the substrate prior to being positioned in contact with the substrate holder.

17. The computer program product of claim 16, wherein the instructions are further configured to use the reconstructed free-form geometry of the substrate to predict an in-plane deformation of the substrate subject to a clamping force used for processing of the substrate.

18. An apparatus configured to reconstruct a free-form geometry of a substrate, the apparatus comprising a processor configured to at least:

obtain a height map of a substrate deformed from a free-form geometry of the substrate, wherein the height map was measured while the substrate was positioned on a substrate holder configured to retain the substrate under a retaining force deforming the substrate from its free-form geometry; and reconstruct the free-form geometry of the deformed substrate based on an expected deformation of the substrate by the retaining force and the measured height map, the free-form geometry being that of the substrate prior to being positioned in contact with the substrate holder.

19. A metrology or inspection apparatus comprising the apparatus of claim 18.

20. A lithographic apparatus comprising the apparatus of claim 18.

* * * * *